United States Patent [19]
Ferla et al.

[11] Patent Number: 5,250,821
[45] Date of Patent: Oct. 5, 1993

[54] ELECTRONIC POWER DEVICE HAVING PLURAL ELEMENTARY SEMICONDUCTOR COMPONENTS CONNECTED IN PARALLEL

[75] Inventors: Giuseppe Ferla; Cesare Ronsisvalle, both of Catania; Pier E. Zani, Genova, all of Italy

[73] Assignees: SGS-Thomson Microelectronisc S.r.L., Brianza; Ansaldo Transporti S.p.A., Naples, both of Italy

[21] Appl. No.: 819,362

[22] Filed: Jan. 9, 1992

[30] Foreign Application Priority Data

May 23, 1991 [EP]  European Pat. Off. ........ 91830215.9

[51] Int. Cl.$^5$ ...................... H01L 25/04; H01L 23/54
[52] U.S. Cl. ................... 257/181; 257/688; 257/123; 257/177
[58] Field of Search ............... 357/74, 79, 76; 257/688, 692, 723, 727, 177, 181

[56] References Cited

U.S. PATENT DOCUMENTS 4,402,004  8/1983  Iwasaki .................... 357/79
4,899,208  2/1990  Dietsch et al. ............. 357/79

*Primary Examiner*—Rolf Hille
*Assistant Examiner*—S. V. Clark
*Attorney, Agent, or Firm*—Wenderoth, Lind & Ponack

[57] ABSTRACT

Plural modular elementary semiconductor power components are respectively contained within plural semiconductor chip regions of a same semiconductor slice. A metallic layer covers a first surface of the semiconductor slice and is commonly connected to anode electrodes of the plural elementary power components. Plural space apart quadrangular metallic layer regions respectively cover the plural semiconductor chip regions on a second surface of the semiconductor slice and are respectively connected to cathode electrodes of the plural elementary power components. Plural first metallic tracks are spaced apart from and surround the respective plural metallic layer regions on the second surface of the semiconductor slice. Each respective first metallic track is connected to a control electrode of the elementary power component contained within the semiconductor chip regions surrounded by the respective first metallic track. Plural second metallic tracks extend spaced apart from and between the plural first metallic tracks to form a lattice configuration on the second surface of the semiconductor slice. Plural fuse elements, for selectively isolating defective elementary power components, are located on the second surface of the semiconductor slice and connect the first and second metallic tracks.

11 Claims, 3 Drawing Sheets

ELECTRONIC POWER DEVICE HAVING PLURAL ELEMENTARY SEMICONDUCTOR COMPONENTS CONNECTED IN PARALLEL

BACKGROUND OF THE INVENTION

1. Field of the Invention

The present invention relates to an electronic power device realized by a plurality of elementary semiconductor components connected in parallel, and to a related manufacturing process.

2. Description of the Related Art

Semiconductor type electronic power devices are presently provided either having a single semiconductor component of a more or less large area, e.g. a thyristor, or having a number of physically separate semiconductor components mounted in parallel on insulated modular units contained in a single package.

Electronic power devices having a single component suffer drawbacks as to the limited value of deliverable power, or even when they do have a high power output current between 1000 A and 3000 A, as to a lesser ease of control and limited switching speed. One high power device having a single component is known in trade by the name "Press Pack".

Electronic power devices having a number of physically separate components have disadvantages associated with the greater complexity of assembly procedures and, in higher power devices, require considerably greater occupied space compared to that of devices of equal power having a single component.

SUMMARY OF THE INVENTION

The purpose of the present invention is to provide a power device, in particular very high power device, which is free from the aforementioned disadvantages of the related art.

These and other purposes are achieved by a device and manufacturing process as described and characterized below.

BRIEF DESCRIPTION OF THE DRAWINGS

The features of the present invention will become more evident by the following description and the annexed drawings related to nonlimiting embodiment examples of the invention. In the drawings.

DETAILED DESCRIPTION OF THE PREFERRED EMBODIMENT

Figure 2:
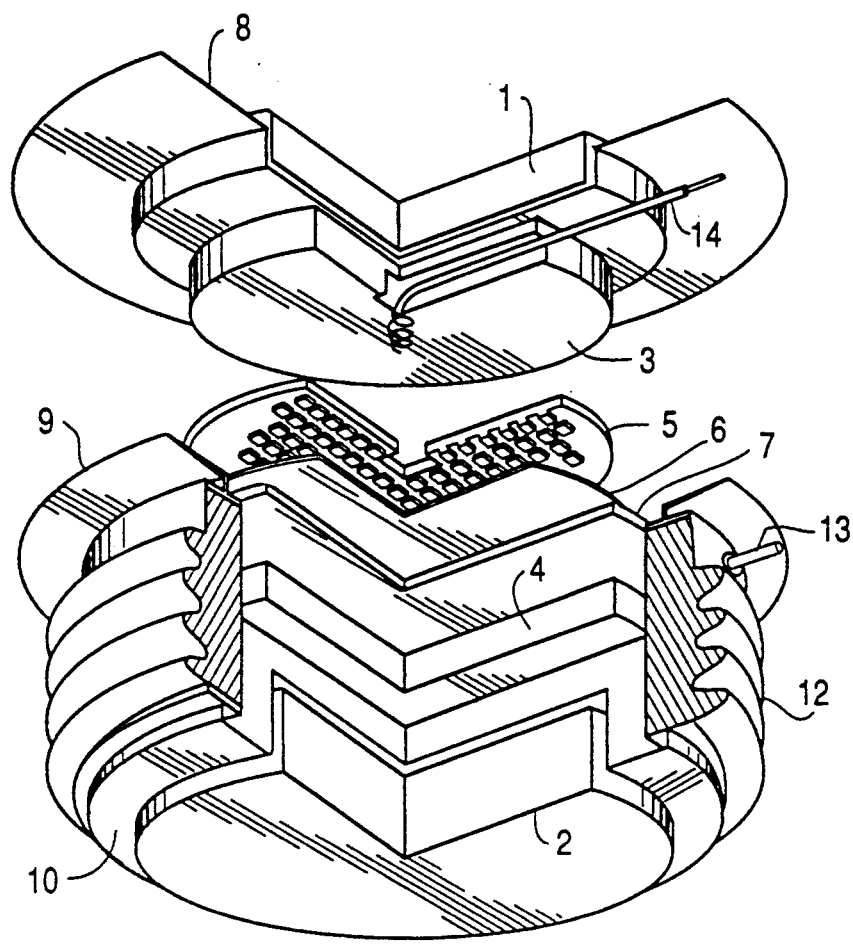
FIG. 2 shows an exploded perspective view of the device of FIG 1.
Figure 1:
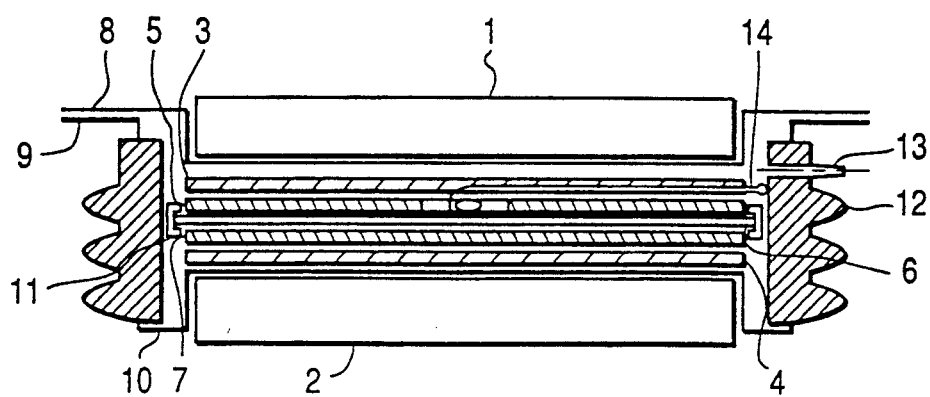
FIG. 1 shows a cross section view of an embodiment of a device in accordance with the present invention.

FIGS. 1 and 2 show two views, a cross section view and an exploded perspective view, respectively, of a power device in accordance with the present invention. Reference numerals 1 and 2 denote nickel plated copper plates constituting the cathode and the anode, respectively, of the device; reference numerals 3 and 4 each denote a molybdenum or tungsten plate; reference numeral 5 denotes a contact washer made of silver plated copper or silver or molybdenum; reference numeral 6 denotes a silicon slice; reference numeral 7 denotes a contact disk made of silver plated copper or silver or molybdenum; reference numerals 8, 9 and 10 denote flanges of nickel plated copper; reference numeral 11 denotes a plastic washer for positioning the silicon slice in the container; reference numeral 12 denotes a porcelain container body; reference numeral 13 denotes a duct and terminal of a control electrode; and reference numeral 14 denotes a filiform metallic element for lead-in of the control signal, with the end part consisting of a spiral spring.

Figure 3:
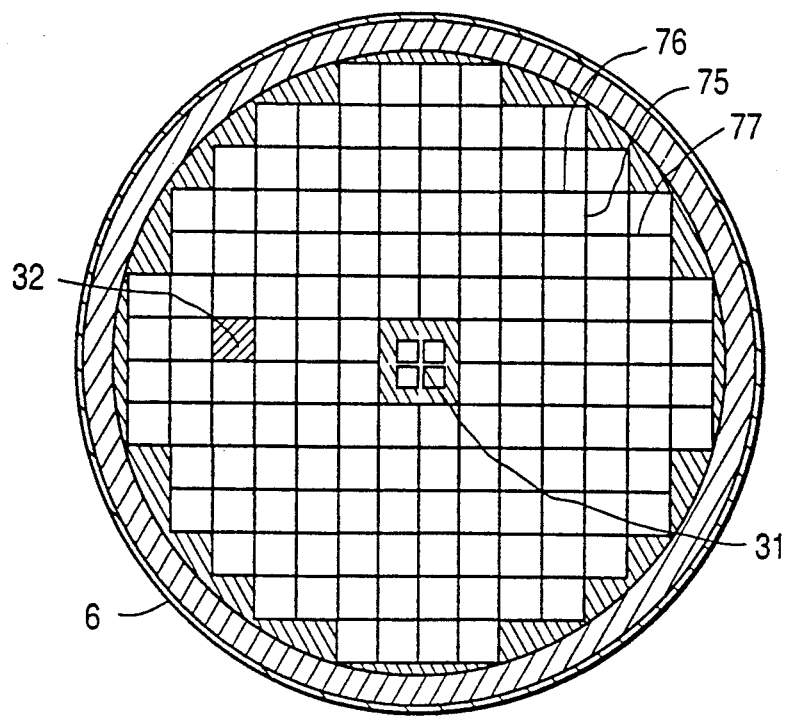
FIG. 3 shows a top view of the silicon slice of FIGS. 1 and 2.

FIG. 3 shows a top view of the silicon slice 6 of FIGS. 1 and 2, having a diameter of 5 inches. A lattice is formed of 15 metallic tracks 75 extending in a column direction and 15 metallic tracks 76 extending in a row direction to define a total of 144 blank quadrangular areas on the top of the silicon slice 6. Each of these areas represents a chip and contains an elementary cathodic metallization, e.g. of aluminum, located on the top surface of the slice 6. The metallizations of the areas are insulated from one another on the top surface of the slice 6. Underlying each of these areas or chips within the slice is an elementary semiconductor component having a cathode region in contact with the elementary cathodic metallization of a corresponding area.

The underlying side (not shown) of the slice 6 is entirely metallized and constitutes a common anodic electrode in contact with anodes of the individual elementary components.

The fifteen column direction extending and fifteen row direction extending aluminum metallic tracks of FIG. 3 run adjacent the elementary cathodic metallizations and are insulated therefrom. The tracks function as lead-in buses for distributing a control signal to control electrodes of the various elementary power components. Also, the metallic tracks have interconnection points at each track crossing 77 and lead to a common quadrangular metallization area 31 (control pad) located at the center of the top surface of the slice 6. The area 31 acts as a common control terminal for all control electrodes of the various elementary semiconductor components.

Figure 6:
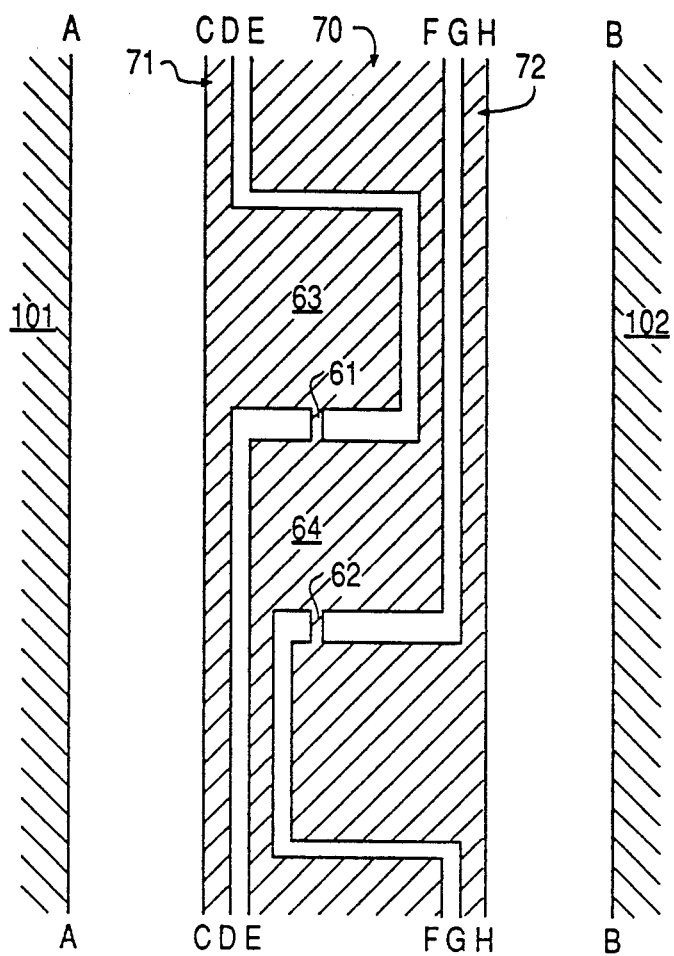
FIG. 6 shows an enlarged top view of a metallic track of the network of metallic tracks on the top of the silicon slice of FIG. 3.

FIG. 6 shows an enlarged scaleless view of a column extending (vertical) metallic track configuration located between two chips (i.e., a "lefthand" chip 101 and a "righthand" chip 102 shown in FIG. 6) in a section intermediate two track crossings. In FIG. 6, line A-A depicts a righthand border of the cathodic metallization of the lefthand chip 101.

Line B-B depicts a lefthand border of the cathodic metallization of the righthand chip 102.

Lines E-E and F-F depict a metallic vertical central bus 70 running therebetween which is interconnected at the track crossings with similar horizontal central buses.

Lines C-C and D-D depict a metallic track 71 extending therebetween which acts as a side control bus for the lefthand chip 101 and which runs along the four sides of the cathodic metallization of the lefthand 101 chip and is insulated therefrom. This metallic track is also insulated from the vertical and horizontal central buses surrounding the lefthand chip 101, except at four connection points respectively located at each side of the lefthand chip 101. This connection point at the righthand side of the lefthand chip 101 to the central bus 70 is shown in FIG. 6 by a metallic jumper 61 made of the same metallic film as that of the tracks 70 and 71.

Lines G-G and H-H depict a metallic track 72 which acts as a side control bus for the righthand chip 102 and which runs along the four sides of the cathodic metallization of the righthand chip 102 and is insulated therefrom. The metallic track 72 is also insulated from the horizontal and vertical central buses surrounding the chip 102 except at four connection points respectively located at each side of the chip 102. This connection point at the lefthand side of the righthand chip 102 to the central bus 70 is shown in FIG. 6 by the metallic bridge 62 which is made of the same metallic film as that of the tracks 70 and 72.

The above description of a vertical section of metallic tracks intermediate two successive crossings also applies, mutatis mutandis, to horizontal sections intermediate two successive crossings.

Figure 7:
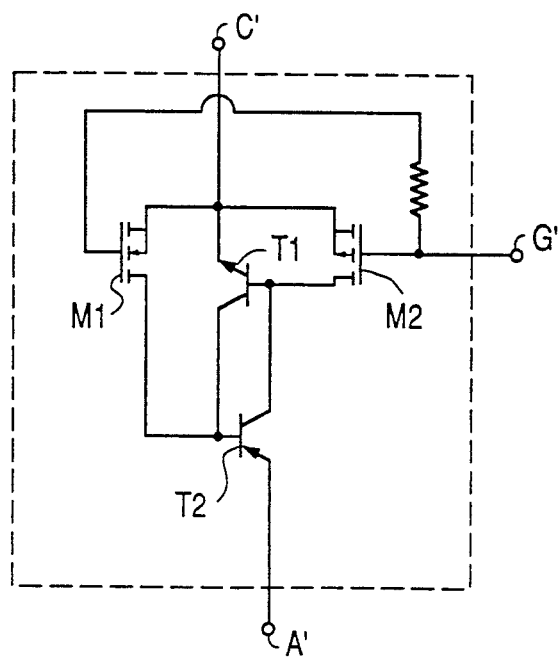
FIG. 7 shows a circuit equivalent to an MCT type elementary power device.

The side control bus of each chip is interconnected, in a manner not shown in the figures but apparent to those skilled in the art, with the control electrode of the elementary component provided in the chip. Such an elementary component can be of the MOS type (Power MOS, IGBT, MCT) or the bipolar type (SCR, GTO, BJT). If an MCT (MOS Controlled Thyristor) component is used, for example, as shown in the equivalent electrical circuit diagram of FIG. 7 (in this figure A', G' and C' respectively represent the anode, gate and cathode electrodes, T1 and T2 represent two bipolar transistors, M1 represents an N-channel MOS and M2 represents a P-channel MOS transistor), the side control bus of each chip will be interconnected with the underlying polysilicon gate layer of the P-channel and N-channel MOS in the MCT.

From the foregoing it is clear that the control electrode of each elementary component is electrically connected to the common control terminal (pad 31) via the side control buses of each chip, the associated points of connection to the central buses and the central buses themselves.

Figure 4:
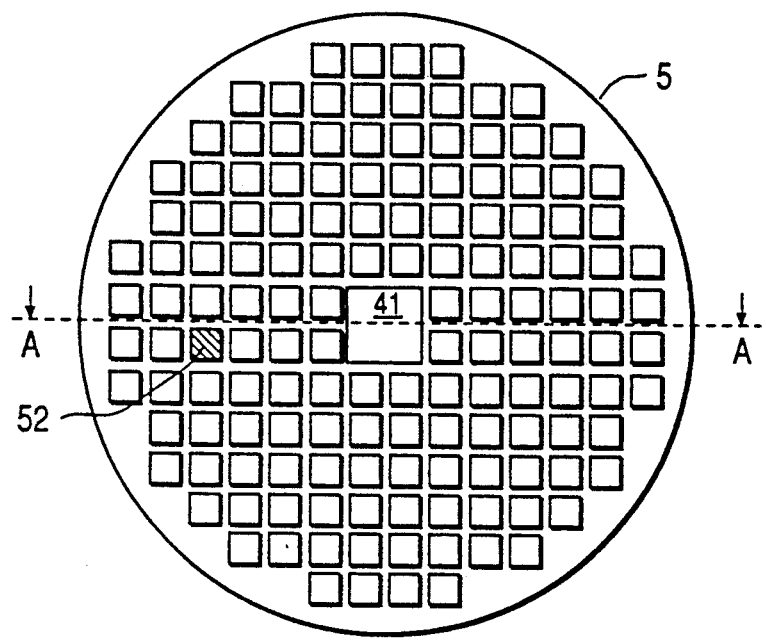
FIG. 4 shows a bottom view of the contact washer of FIGS. 1 and 2.
Figure 5:
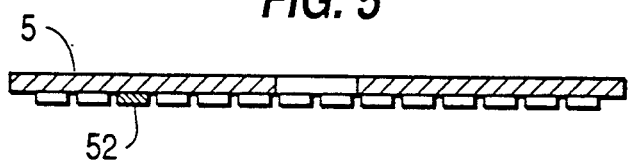
FIG. 5 shows a cross section of the contact washer of FIG. 4.

FIG. 4 depicts a bottom view and FIG. 5 a cross section view along plane A-A of FIG. 4 of the contacting washer 5 which includes along the bottom surface thereof a lattice of grooves corresponding to the same lattice arrangement of metallization tracks on the top surface of the slice 6. These grooves divide the bottom side of the contacting washer in 144 quadrangular reliefs which function to contact the elementary cathodic metallizations of the slice 6 while avoiding contact with the central and side buses of the tracks of the slice 6 by adequately sizing the width of the respective grooves. In the center of the contacting washer there is a quadrangular opening 41 for allowing passage of the terminal spring part of the lead-in wire 14 for the control signal.

The significance of dividing the metallization tracks of the slice 6 into central and side buses, and the presence of connection points between the central and side buses, is discussed below.

A case in which all the elementary components provided in a silicon slice 6 of the type shown in FIG. 3 will be operational at the end of the manufacturing process is an entirely theoretical eventuality. In reality, all of the components in the slice 6 must be subjected to acceptance testing at the end of the processing.

Normally, following such testing, some components (chips) are found to be defective and hence must be made electrically inactive. The structural characteristics of the device in accordance with the present invention serve advantageously for this purpose.

Assume for example that the chip 32 of FIG. 3 is found to be defective upon inspection. In such a case, the chip 32 is made inactive by eliminating the connection points between each side bus of the chip 32 and the adjacent horizontal and vertical central buses, and also by eliminating the contact of the cathodic metallization of the chip 32 with the washer 5.

Elimination of the connection points is very easy. Suppose that the defective chip 32 corresponds to the lefthand chip 101 in FIG. 6. To eliminate the righthand connection point chip 32 and the control bus 64, the jumper 61 is removed by applying two electrodes of opposite electric polarity on the two spaces 63 and 64 shown in FIG. 6 to generate a sufficiently strong current to cause fusion of the jumper 61. The same process is carried out for the connection points of the other side buses of the chip 32. It is thus seen that the connection points between side and central buses also usefully function as fuses.

To eliminate the contact between the cathodic metallization of the chip 32 and the washer 5 there must be no corresponding quadrangular contact relief (52 in FIGS. 4 and 5) in the washer. To achieve this there are two ways to proceed:

1) providing the washer 5 after the acceptance test of the chip and then using a photoetching mask of the washer which excludes the relief 52; or 2) providing before the acceptance test a washer 5 having all the contacting reliefs and then, after the chip test, mechanically removing, e.g. using a step cutter, the relief 52.

It is also advantageous to put in place of the absent metallic relief 52 a thin layer of insulating material, e.g. a layer of mica fixed with a bonding agent, designed to prevent any electrical discharges between the cathode and the node of the defective power component during operation.

Once the defective chips have been deactivated as explained above, the device is ready for assembly. The silicon slice, the contacting washer, the contacting disk and the two molybdenum or tungsten disks are placed in the ceramic body 12 in accordance with the arrangement shown in FIGS. 1 and 2. Subsequently, in accordance with the known process for the "press pack" package, the device is closed and sealed permanently by welding the copper flanges in a pure nitrogen environment, such nitrogen remaining incorporated in the package.

When the device has been closed and the metallic plates 1 and 2 have been applied thereto, it is ready for installation. In the installed device, the internal contacts (anode, cathode and gate) for connecting the internal components to the user's external circuit are provided by free pressure contacts. More specifically, the anode and cathode contacts consist of copper poles of the "press pack" package which, when subjected to sufficient pressures, ensure the passage of thousands of amperes and dissipation of the heat generated in the power component, while the gate contact is ensured by pressure exerted by the terminal spring of the wire 14 on the pad 31 in the center of the slice, the wire 14 serving as an external connection through the duct 13 passing through the ceramic of the press pack capsule (FIGS. 1 and 2).

The advantages of the above described device are apparent. In particular, the device makes it possible:

- to achieve a switching speed and piloting ease typical of components of small power and, at the same time, occupies a reduced space which is characteristic of more powerful devices provided by a single component;
- to minimize the space occupied by the various elementary components placed in parallel by using the same slice on which they were provided;
- to use a package already on the market (the press pack) having excellent heat dissipation characteristics;
- to assemble with extreme ease and speed, due to the specific structure of the contacting washer 5, the arrangement of the metallic gate tracks and the presence of connection points (fuses) between the central and side buses which allows for fast and safe deactivation of defective components;
- to provide power devices, especially MOS technology devices, with good yield.

Obviously numerous modifications, adaptations, variations and substitutions of elements with others functionally equivalent are possible to the preferred embodiments described above without departing from the scope of the following claims.

One such variation could, for example, concern the insulation provided between defective chips and the upper contacting washer, which could be ensured by a layer of insulation other than mica or even by the nitrogen atmosphere filling the package.

Another variation could concern the connection points between the side and central buses which could be provided in another way, e.g. with other kinds of fuses.

We claim:

1. An electronic power device in which a plurality of elementary semiconductor power components are connected in parallel, said device comprising:
    a plurality of modular elementary semiconductor power components respectively contained within a plurality of semiconductor chip regions of a same semiconductor slide having opposite first and second surfaces, each of said modular elementary power components having an anode electrode, a cathode electrode and a control electrode;
    a metallic layer covering said first surface of said semiconductor slice and commonly connected to said anode electrodes of said plurality of modular elementary semiconductor power components;
    a plurality of spaced apart metallic layer regions respectively covering said plurality of semiconductor chip regions on said second surface of said semiconductor slice and respectively connected to said cathode electrodes of said plurality of modular elementary semiconductor power components;
    a plurality of first metallic tracks respectively spaced apart from and surrounding said plurality of metallic layer regions on said second surface of said semiconductor slice, each respective first metallic track connected to the control electrode of the modular elementary semiconductor power component contained within the semiconductor chip region surrounded by the respective first metallic track;
    a plurality of second metallic tracks extending spaced apart from and between said plurality of first metallic tracks on said second surface of said semiconductor slice to form a lattice configuration on said second surface of said semiconductor slice;
    a control pad located on said second surface of said semiconductor slice and electrically connected to said plurality of second metallic tracks; and,
    a plurality of connection elements, located on said second surface of said semiconductor slice, respectively connecting each of said plurality of first metallic tracks to at least one adjacent one of said plurality of second metallic tracks.

2. An electronic power device as recited in claim 1, further comprising a contact washer having on one side thereof a plurality of metallic reliefs respectively contacting said plurality of spaced apart metallic layer regions located on said second side of said semiconductor slice.

3. An electronic power device as recited in claim 1, wherein each of said plurality of connection elements is a fuse.

4. An electronic power device as recited in claim 3, wherein a dimension of a metallic surface region of each of said plurality of first and second metallic tracks is increased at each location which contacts one of said plurality of connection elements.

5. An electronic power device as recited in claim 3, wherein each of said fuses consists essentially of a thin metallic track extending from one of said first plurality of metallic tracks to one of said second plurality of metallic tracks on said second side of said semiconductor slice.

6. An electronic power device as recited in claim 2 or 3, wherein each of said plurality of first metallic tracks which surrounds a metallic layer region covering a semiconductor chip region containing a defective elementary semiconductor power component is electrically isolated from said plurality of second semiconductor tracks.

7. An electronic power device as recited in claim 2 or 3, wherein said contact washer does not have a metallic relief in contact with each metallic layer region which covers a semiconductor chip region containing a defective elementary semiconductor power component.

8. An electronic power device as recited in claim 7, wherein each metallic layer region which covers a semiconductor chip region containing a defective elementary semiconductor power component is isolated from said contact washer by an insulating material.

9. An electronic power device as recited in claim 8, wherein said insulating material is mica.

10. An electronic power device as recited in claim 2, wherein said contact washer is silver plated copper or silver or molybdenum.

11. An electronic power device as recited in claim 2 or 10, wherein said semiconductor slice and said contact washer are contained in a press pack package which comprises:
    a contact disc of silver plated copper in contact with said first side of said semiconductor slice;
    two molybdenum or tungsten plates respectively overlying said contact washer and said contact disc;
    a porcelain housing containing said semiconductor slice, said contact washer, said contact disc and said two molybdenum or tungsten plates;
    a plastic washer insert in a contour of said semiconductor slice to stabilize a position of said semiconductor slice within said porcelain housing;

an insulated filiform metallic element having a metallic spring extending through an opening in said contact washer in contact with said control pad located on said second side of said semiconductor slice;

two or more nickel plated copper flanges closing said porcelain housing; and two nickel plated copper plates respectively overlying said flanges and respectively constituting an anode and a cathode of the electronic power device.

* * * * *